United States Patent [19]

Pauker et al.

[11] Patent Number: 4,638,240
[45] Date of Patent: Jan. 20, 1987

[54] BASE DRIVE CIRCUIT FOR HIGH-POWER SWITCHING TRANSISTOR

[75] Inventors: Armando Pauker, Sunnyvale; Richard B. Preuit, Cupertino, both of Calif.

[73] Assignee: Tandem Computers Incorporated, Cupertino, Calif.

[21] Appl. No.: 805,497

[22] Filed: Dec. 5, 1985

[51] Int. Cl.$^4$ ..................... H02P 13/20; H02M 3/335
[52] U.S. Cl. ................................. 323/289; 363/16; 363/97; 307/280; 307/300
[58] Field of Search .............................. 363/16, 97–98, 363/132, 133–134; 323/289; 307/270, 280, 300

[56] References Cited

U.S. PATENT DOCUMENTS

| | | | |
|---|---|---|---|
| 2,981,850 | 4/1961 | Hoskinson | 307/280 |
| 3,569,742 | 3/1971 | Schroeder | 307/300 X |
| 3,983,418 | 9/1976 | Wallace | 323/289 X |
| 4,308,577 | 12/1981 | Mentler | 323/289 X |
| 4,312,029 | 1/1982 | Zellmer | 307/300 X |
| 4,420,804 | 12/1983 | Nishino | 323/289 X |

OTHER PUBLICATIONS

R. Hammond et al., "High Power Vector Summation Switching Power Amplifier Development", PESC'81, IEEE, Boulder, Co, USA (29 Jun.–3 Jul. '81), pp. 267–272.

Primary Examiner—Peter S. Wong
Attorney, Agent, or Firm—Townsend and Townsend

[57] ABSTRACT

Disclosed is a base drive circuit that provides a base drive current particularly adapted to switch a switching power transistor ON and OFF quickly. The base drive current includes a variable AC impedance device that responds to a control pulse to form a base drive having (a) an initial forward base drive peak that drives the switching power transistor toward deep saturation momentarily, followed by (b) an intermediate drive current of lower magnitude, sufficient to keep a high-power transistor at or near saturation, and (c) a high-amplitude reverse drive current for high-speed turn-off of the transistor.

20 Claims, 4 Drawing Figures

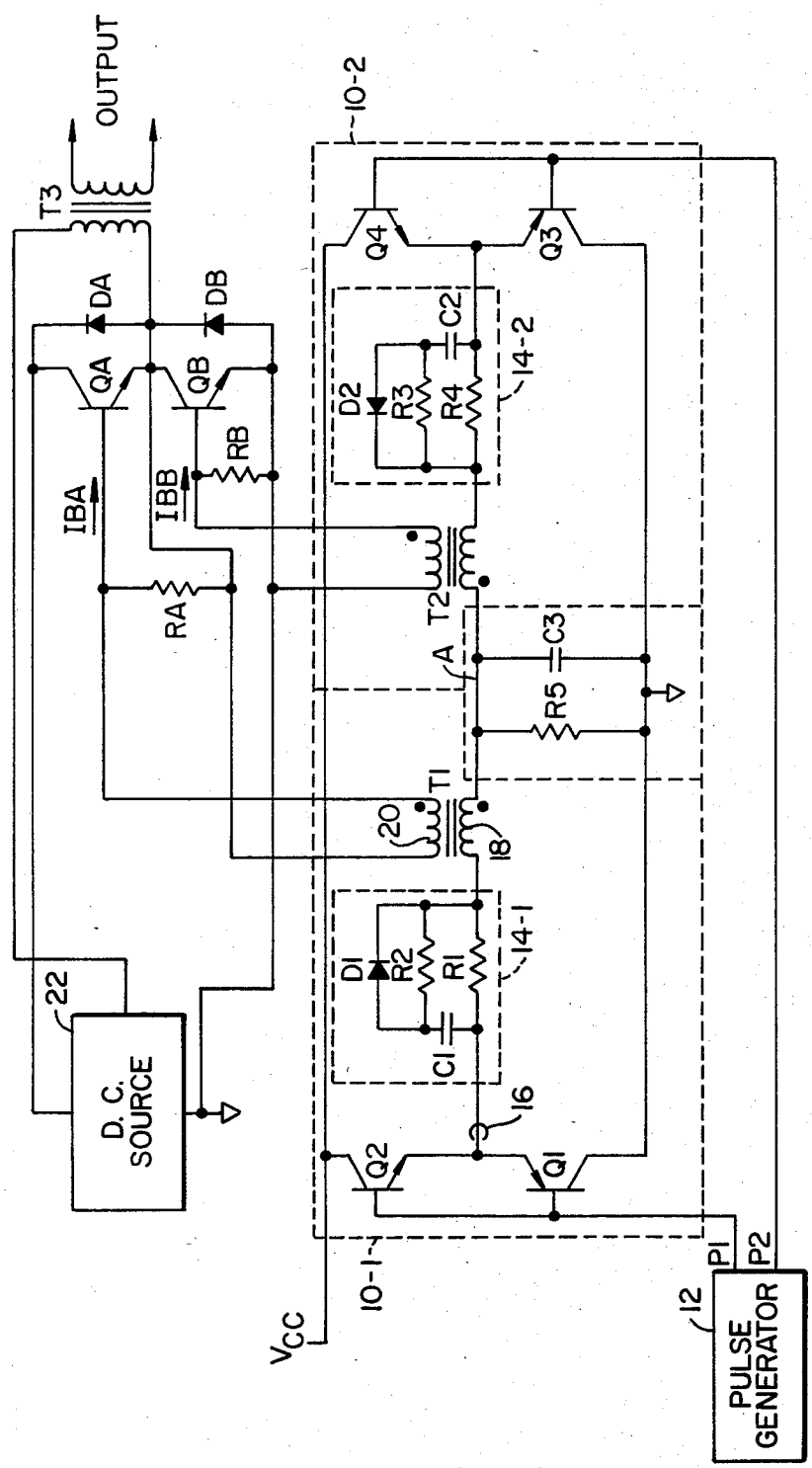
FIG._1.

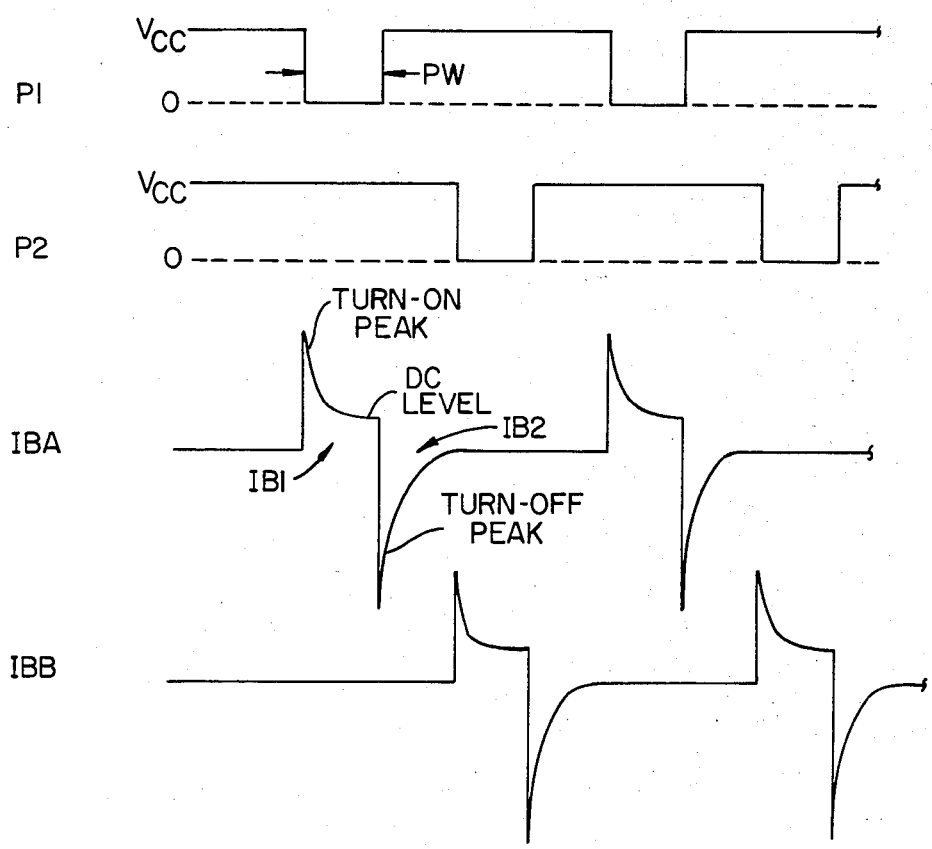
FIG._2.
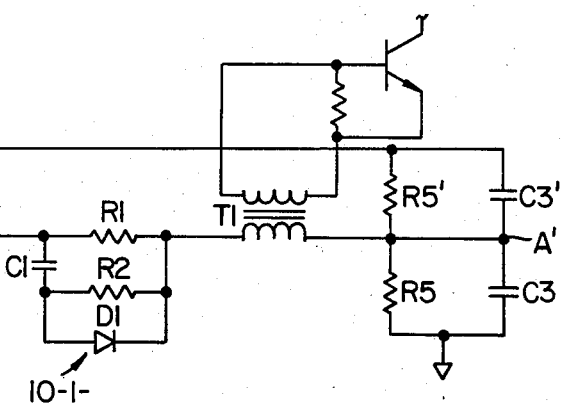
FIG._3.
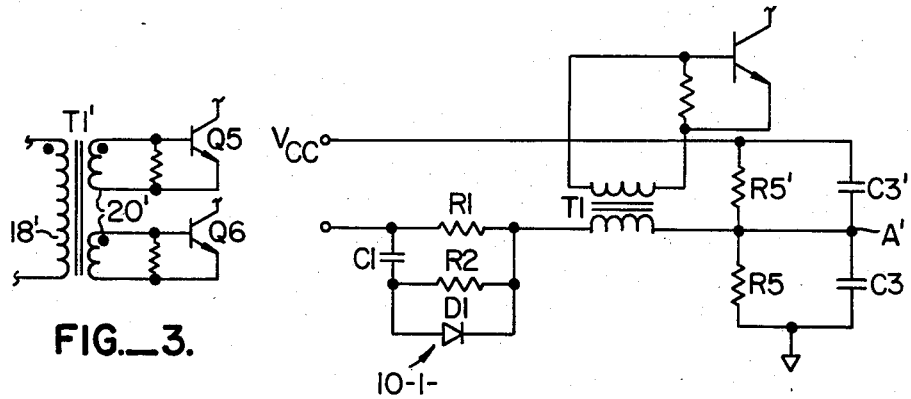
FIG._4.

BASE DRIVE CIRCUIT FOR HIGH-POWER SWITCHING TRANSISTOR

BACKGROUND OF THE INVENTION

The present invention relates generally to high-frequency power conversion, and more particularly to a base drive circuit used to turn on and turn off high-power switching transistors.

In the design of switch mode power supplies, the object is to produce an AC-type waveform which will then be transformed, rectified and filtered to produce a DC voltage. To generate the AC-type waveform, switch mode power supplies often utilize one, two, or more power switches in various configurations. Symmetrical configurations, those having an even number of power switches, generate AC waveforms by operating the switches so that when one-half of the switches are turned on the other one-half of them are off; one-half of the switches controls the application of a positive DC voltage to a load, while the other one-half controls the application of a negative DC voltage, with the result that by operating the switches in a push-pull manner an AC-type voltage is applied to the load.

Bipolar transistors are frequently used as the power switches because of their fast switching speed and ability to handle high voltages and currents. In order to rapidly turn on and off conduction of these transistors, and thus be able to generate a high-frequency AC-type voltage, a base drive circuit couples control pulses to the respective bases of the power transistors to switch them into and out of their conductive states.

Switching circuits of the type to which this present invention are directed typically include an input stage that couples a control signal, usually in the form of a pulse train, to the primary winding of an isolation transformer. The secondary winding is coupled to the base lead of the switching power transistor. The switching transistor drives a primary winding of a high-frequency power transformer.

In order to achieve high efficiency, the power transistor is operated at relatively high frequency (in the kilohertz range), requiring the power transistor to be driven into its conducting and non-conducting states quickly. To hasten transition of the power transistor from its non-conducting to its conducting state (i.e., OFF to ON), the amplitude of the forward base drive current (IB1) must be relatively high. Unfortunately, if the base drive current is maintained at this amplitude for the time of the pulse the base drive circuit consumes more power than desired, and the design of the base drive circuit must take this fact into consideration. In addition, the continuous high amplitude drives the transistor deeply into saturation, causing the turn-off time to be extended because of the time required to sweep out stored charge from the transistor before it can turn OFF, and resulting in excessive power dissipation in the transistor.

Further, in order to drive the switching transistor OFF in as short a transition time as possible, a reverse base drive current (IB2) having a negative-going amplitude can be provided. Unfortunately, to provide such negative-going IB2 signals, a negative power supply is often needed.

SUMMARY OF THE INVENTION

Accordingly, the present invention provides a wave-shaping circuit in the base drive circuit of a switch mode power supply that couples a control pulse to the base of a switching power transistor in the form of a forward base drive current (IB1) that includes an initial high-amplitude peak portion, an intermediate portion that decreases to a level sufficient to keep the transistor at or near saturation, and a negative high-amplitude peak portion forming a reverse base drive current (IB2). The invention produces this base drive current with a minimum of parts and with a single-ended power source. Further, as will be seen, the invention can be adapted to optimal performance, matching the particular characteristics of the switching transistors used.

In the preferred embodiment of the invention, the circuit includes a first resistance that connects an input terminal, adapted to receive a control pulse, to a primary winding of an isolation transformer. The secondary winding of the isolation transformer is coupled to the base of the switching transistor. In parallel with the resistor is a series-connected capacitor and second resistor (of a value less than the first). This combination of components (the two resistors and the capacitor) forms that portion of the wave-shaping circuit that generates the initial and intermediate portions of forward base drive current applied to the switching transistor. Connected in parallel with and across, the second resistor is a high-speed diode configured to turn on when the control pulse terminates.

When a control pulse is applied to the input terminal the invention responds to the initial edge of the pulse to induce an initially large current flow through the primary winding of the transformer. As the capacitor charges, the current decreases to a lower steady-state value, until the trailing edge of the control pulse occurs. The diode responds to the trailing edge of the control pulse to turn ON, to create a very low impedance across both resistances, in effect reconfiguring the wave-shaping circuit in a manner that induces a high reverse current to flow through the primary winding. The reverse current terminates when all the stored charge is swept from the power transistor.

The initial and final high current peaks are coupled to the base of the switching transistor, operating to provide a forward-base current (IB1) and a reverse-base current (IB2) that quickly turns the transistor on and off, respectively. At the same time, the initial current peak is followed by a base current of reduced amplitude, sufficient to keep the transistor at or near saturation. This reduced amplitude forward-base drive current reduces the power consumed by the base drive circuit of the power transistor.

In addition, the base drive circuit incorporating the present invention is uniquely configured to operate from a single power source. In this respect, a second capacitor sets a DC voltage level that forms the AC ground for the circuit, deleting the need for a second power source.

A number of advantages are achieved by the present invention. The invention allows, with a minimum of parts, a technique to produce an ideal IB1 and IB2 current drive ratio that can be optimized to the particular transistor and application.

Additionally, the present invention provides a forward base drive current IB1 that is not a continuous DC current level. To the contrary, the forward base drive current of the present invention provides an initial high peak to turn on the switching transistor very quickly, and then drops to a lower DC level sufficient to keep the transistor at or near saturation. The low DC current level is easily adjustable (by the first resistance) to suit the forced beta requirements of the application, and to minimize the power dissipated by the switching transistor.

Similarly, the reverse drive base current IB2 level is not a continuous DC level. The present invention provides a short, high reverse current peak to quickly sweep stored charge from the switching transistor and thereby turn it off very fast. This also provides a power dissipation saving because the reverse base drive current IB2 level is now only a brief pulse.

Further still, the present invention provides the positive and negative-going peak signals with the use of a single-ended power source. It does not require two power sources, one negative and one positive.

These and other advantages of the present invention will become apparent to those skilled in the art upon a reading of the following detailed description of the invention, which should be taken in conjunction with the accompanying drawings.

BRIEF DESCRIPTION OF THE DRAWINGS

FIG. 1 illustrates a switching circuit having a base drive circuit that includes the wave-shaping mechanism of the present invention;

FIG. 2 is a waveform diagram of the input pulse voltage and the current generated by the present invention;

FIG. 3 illustrates a switching circuit configured so that a single base drive circuit can drive multiple switching transistors; and FIG. 4 illustrates a base drive circuit in a "uni-polar" configuration.

DETAILED DESCRIPTION OF THE INVENTION

Turning now to the Figures, and in particular FIG. 1, there is shown base drive circuits 10-1 and 10-2 are respectively coupled to supply base drive currents (via coupling transformers T1 and T2, respectively) IB1 and IB2 to switching power transistors QA and QB. The base drive currents IBA and IBB are formed in response to pulsed control signals P1 and P2 provided by a pulse generator 12. The power switching transistors QA and QB are operated substantially 180° out of phase, each alternately switching between conducting and nonconducting states to generate, in a push-pull manner, an AC-type voltage that is coupled through an output transformer T3. A DC supply 22 provides the DC voltage that is converted by the switching power transistors QA and QB to the AC-type voltage.

As will be seen, the base drive currents IBA and IBB include three portions: An initial, fast-rising current peak (IB1) that functions to turn the switching power transistors QA, QB on quickly; a mid-portion current that supplies sufficient base drive to the switching power transistors QA and QB, ideally in proportion to the collector current if possible, to keep the transistors in or near saturation; and a fast-rising, negative current peak (IB2) that operates to sweep out any stored charge, minimizing the storage time and turn-off time.

During the OFF time, the bases of the transistors QA and QB are clamped to their respective emitters through low impedances, such as resistors RA and RB, respectively. These low impedances minimize false turn-on due to noise and capacitively coupled currents induced in other parts of the circuit. The diodes DA and DB function to protect the switching power transistors QA and QB, respectively, from reverse voltage spikes appearing across the emitter-collector terminals.

The base drive currents, IBA and IBB, are produced by the base drive circuits 10-1 and 10-2, respectively. More specifically, it is the function of the wave-shaping circuits of the present invention, designated by the numerals 14-1 and 14-2, to provide the fast-rising turn-on and turn-off current peaks. As can be seen in FIG. 1, the base drive circuit 10-1 that produces the base drive current IBA for the switching power transistor QA is identical to the base drive circuit 10-2 that produces the base drive current IBB for the switching power transistor QB. Accordingly, only the construction and operation of the base drive circuit 10-1 will be described, it being understood that the description of the construction and operation can be applied equally to the base drive circuit 10-2.

As FIG. 1 illustrates, the base drive circuit 10-1 includes a current buffer comprising a PNP transistor Q1 and a NPN transistor Q2 connected in totem pole circuit fashion between a supply voltage $V_{cc}$ and ground. (The current buffer is used in high-power situations, and may not be needed for low-power application.) The base leads of the transistors Q1 and Q2 are connected together and to the pulse generator 12 to receive a control signal P1. The emitter leads of the transistors Q1 and Q2 are connected together and to an input terminal 16 that, in turn, connects to the wave-shaping circuit 14-1 of the present invention. The wave-shaping circuit 14-1, in turn, is coupled to one lead of a primary winding 18 of a coupling transformer T1.

The second lead of the coupling transformer T1 is connected to ground through a parallel circuit consisting of a capacitor C3 and a resistor R5 that is shared with the base drive circuit 10-2. Through the use of capacitor C3 the base drive circuits are capable of being operated from a single supply voltage, $V_{cc}$. The capacitor functions to (1) set an AC ground, as noted above, and (2) provide energy for both base drive circuits 10-1 and 10-2 without itself dissipating power.

The secondary winding 20 of the transformer T1 has one lead connected to the base terminal of the power switching transistor QA, the other lead being connected to the emitter lead of said transistor.

The wave-shaping circuit 14-1 includes a first resistance R1 that connects the input terminal 16 to the primary winding 18. Connected in parallel with the first resistance R1 are a capacitance C1 and a second resistance R2 connected in series circuit configuration with each other. A fast-switching diode D1 is connected in parallel across the second resistance R2, the diode D1 having its anode lead connected to the capacitance C1 and its cathode lead connected to the resistances R1 and R2, as well as the primary winding 18 of the coupling transformer T1.

In operation, referring to FIGS. 1 and 2 jointly, the control signal P1, a waveform having negative-going pulses, is applied to the base leads of the transistors Q1 and Q2. Typically, the control signal P1 has a pulse reoccurrence frequency (PRF) of approximately 25 KHz, a pulse width (PW) of approximately 10 microseconds. As illustrated in FIG. 2, the control signal P2 that is applied to the base current drive circuit 10-2 is approximately 180° out of phase with the control signal P1.

When the control signal P1 is HIGH the PNP transistor Q1 is OFF and the NPN transistor Q2 is ON connecting the supply voltage $V_{cc}$ to the input terminal 16.

When the control signal P1 goes LOW, transistor Q2 turns OFF and transistor Q1 turns ON, pulling the input terminal 16 toward ground. This provides a discharge path for charged capacitor C3, creating a current to flow through the primary winding 18, the wave-shaping circuit 14-1, and through the transistor Q1 to ground. The value of that current flow will be determined primarily by the resistance R2 (actually by a resistance formed by the parallel configuration of resistances R1 and R2, but if resistance R2 is much less than resistor R1, resistance R2 will control) because initially the capacitor C1 will be a low impedance and transparent to current flow.

This initial current flow is coupled by the transformer T1 to the base of the switching power transistor QA as the base drive current IB1, appearing thereat as the TURN-ON PEAK current illustrated in FIG. 2.

While the control signal P1 is LOW, the capacitor C1 charges, and as it charges the current flow through the primary winding 18 will decrease exponentially until a lower value is reached, resulting in the mid-portion of the base drive current IB1 labeled DC LEVEL in FIG. 2. This DC LEVEL is determined primarily by the resistance R1 since the resistance R2 has been taken out of the picture by the (now) substantially charged capacitor C1. In effect, C1 acts as a variable AC impedance device.

When the control signal P1 returns from the LOW to a HIGH the PNP transistor Q1 turns OFF, NPN transistor Q2 turns ON, and the input terminal 16 is pulled to the supply voltage $V_{cc}$. Transistor Q2 couples a voltage to the anode of the diode D1 that is higher than that applied to the cathode, forward-biasing the diode D1 and turning it ON. This action effectively places a current short across the resistances R1 and R2. Current that had previously been flowing through the primary winding 18 of the transformer T1 from the wave-shaping circuit 14-1 reverses and begins recharging capacitance C3, limited only by the relatively negligible impedances presented by the diode D1, the capacitance C1, and the resistive impedance of the primary winding 18. Accordingly, at this time the base drive current IBA applied to the base of the switching power transistor QA experiences a rather large reverse current (IB2) turn-off peak, as illustrated in FIG. 2, that functions to sweep out stored charge at the junctions of the transistor QA, quickly turning it OFF.

The base drive current IBB produced by the base current drive circuit 10-2 operates in a substantially identical manner in response to the control signal P2 which, as indicated above, is 180° out of phase with the control signal P1.

Note that the power switching transistors QA and QB are driven ON by a high initial current, but are not driven deeply into and held in deep saturation. Rather, the TURN-ON PEAK of the base drive current IBA functions to provide a high amplitude drive current for a short time to drive the switching power transistor quickly into conduction. Thereafter, the base drive current returns to a lower amplitude (DC LEVEL) to inhibit the switching power transistor QA from dissipating excess power. In addition, the switching power transistor can be turned OFF much quicker because it is not deeply in saturation at turn-off time, assisted by the TURN-OFF PEAK that quickly sweeps out stored charge.

The switching circuit of FIG. 1 illustrates use of the invention in a switching circuit that uses one base drive circuit 10-1 or 10-2 to operate one switching power transistor QA or QB, respectively. FIG. 3 illustrates a circuit configuration in which the coupling transformer T1 (FIG. 1) is replaced with a coupling transformer T1'(FIG. 3). As FIG. 3 shows, the transformer T1' has a single primary winding 18' and multiple (two in FIG. 3) secondary windings 20'. Each secondary winding is coupled to a corresponding switching power transistor Q5, Q6. Operation is substantially the same as that described above with respect to FIG. 1.

FIG. 1 illustrates what may be called a balance base drive circuit configuration; that is, the base drive circuits 10-1, 10-2 share the AC ground-setting capacitor C3. The alternate operating cycles of the base drive circuits (since operation of each base drive circuit 10-1, 10-2 is 180° out of phase of the other) function to establish an AC ground at voltage node A somewhere between $V_{cc}$ and ground. If, however, only one of the base drive circuits 10-1, 10-2 is used, compensation for the absence of the absent base drive circuit must be made; otherwise, the voltage node corresponding to voltage node A in FIG. 1 will tend to rise toward $V_{cc}$.

Such compensation is illustrated in FIG. 4, showing a base drive circuit 10-1' in a "uni-polar" configuration. In order to ensure that the voltage node A establishes an AC ground with sufficient operating clearance between $V_{cc}$ and ground, there is added the parallel configuration of capacitor C3' and resistance R5' that connect the voltage node A' to $V_{cc}$. The values of C3' and R5', as will be apparent to those skilled in this art, will establish the DC value that the voltage node A' assumes during operation.

It will be appreciated by those skilled in this art that the invention is capable of modification. For example, it is possible that the wave-shaping circuits 14-1 and 14-2 can be made a part of the base circuits of the power switching transistors QA and QB, respectively. This is believed less desirable, however, because circuit layout becomes much more difficult if the International Safety Standard (VDE0806) need be met. Having the wave-shaping circuits 14-1, 14-2 as shown in FIG. 1 makes it much easier to meet creepage and clearance requirements.

Other modifications can obviously be made without departing from the spirit and scope of this invention.

We claim:

1. A wave-shaping circuit for producing a base drive current to be applied to a power switching transistor by a coupling transformer, the current being produced in response to a control pulse, the circuit comprising:
   an input terminal adapted to receive the control pulse;
   a first resistance coupling the input terminal to the primary winding of the coupling transformer;
   variable impedance means coupled to the first resistance for varying the impedance between the input terminal and the primary winding in response to the control pulse.

2. The wave-shaping circuit of claim 1, including a diode connected across and in parallel with the first resistance, the diode being operable to conduct in response to a trailing edge of the control pulse.

3. The wave-shaping circuit of claim 1, wherein the variable impedance means includes a second resistance and a capacitance means connected in series configuration with one another, and in parallel with the first resistance.

4. The wave-shaping circuit of claim 1, wherein, in response to the leading edge of the control pulse the variable impedance means forms a current path having an impedance less than that of the first resistance, the current path impedance increasing during existence of the control pulse.

5. In a base drive circuit of the type configured to provide forward and reverse base drive currents to a primary winding of a coupling transformer coupled to an input terminal of a power switching device, apparatus for forming the forward and reverse base drive currents from a control pulse signal having initial and terminal edges, the apparatus comprising:
   an input terminal adapted to receive the control pulse;
   first circuit means connecting in series the input terminal to the primary winding for producing a first current through the primary winding in response to the control pulse, the first current having a first amplitude portion followed by a second amplitude portion of lesser magnitude than the first; and
   second circuit means coupled in parallel with the first circuit means for producing a second current in the primary winding of opposite polarity to the first current in response to the terminal edge of the control pulse.

6. The apparatus of claim 5, wherein the first circuit means is configured to form, in response to the control pulse a current path having an impedance of a first magnitude that increases to a greater magnitude during existence of the control pulse.

7. The apparatus of claim 5, wherein the first circuit means includes first resistance means forming a first current path between the input terminal and the primary winding.

8. The apparatus of claim 7, wherein the first circuit means includes capacitive means and second resistive means connected to form a series current path that is in parallel with the first current path.

9. The apparatus of claim 8, including a diode connected in parallel with the second resistive means and operable to conduct at the terminal edge of the control pulse.

10. In a switching circuit of the type having a power switch transistor configured to receive a switching signal having turn-on and turn-off pulses that drive the transistor into and out of a current-conducting state, respectively, a wave-shaping circuit for providing the switching signal, the wave-shaping circuit comprising:
   an input terminal for receiving a control pulse;
   a first resistance coupled between the input terminal and the base lead of the power switching transistor; and
   capacitive means and a second resistance connected in series circuit configuration to one another and in parallel circuit configuration with the first resistance.

11. The wave-shaping circuit of claim 10, wherein the control pulse alternately assumes a first and a second voltage level, the wave-shaping circuit including switch means coupled to provide a current path substantially less than that provided by the second resistance around said second resistance when the control pulse assumes the second voltage level.

12. The wave-shaping circuit of claim 11, wherein the switch means includes a diode coupled in parallel circuit configuration with the second resistance.

13. Apparatus for switching a power switching transistor into and out of conduction in response to a control pulse operable between a first voltage and a second voltage, the apparatus comprising:
   an input terminal for receiving the control pulse;
   a coupling transformer having a primary winding and at least one secondary winding, the secondary winding being coupled to a base lead of the power switching transistor, the primary winding having a first terminal coupled to the input terminal and a second terminal; and
   charge storage means coupling the second terminal of the primary winding to the second voltage.

14. The apparatus of claim 13, wherein the second voltage is a ground potential.

15. The apparatus of claim 13, including a plurality of power switching transistors, and wherein the coupling transformer includes a number of individual secondary windings each coupled to a base lead of a corresponding one of the plurality of power switching transistors.

16. Apparatus for alternately switching at least a pair of power switching transistors into and out of conduction in response to a control pulse operating between first and second voltages, the apparatus comprising:
   at least a pair of coupling transformers, each having at least one secondary winding coupled to a base lead of a corresponding one of the power switching transistors, and a primary winding;
   charge storage means;
   input means adapted to receive the control pulse; and
   means coupling the input means, the primary windings, and the charge storage means to form a first current path from the input means through a one of the primary windings and the charge storage means to the second voltage, and a second current path from the input means through the other of the primary windings and the charge storage means to the second voltage.

17. The apparatus of claim 16, including a wave-shaping means inserted in the first and second current paths, the wave-shaping means being operable to provide a first impedance when the central pulse changes from substantially the first voltage to the second voltage, the first impedance increasing with time thereafter.

18. The apparatus of claim 17, the wave-shaping circuit including switch means operable in response to the control pulse changing from the second voltage to the first voltage to provide a low-impedance current path.

19. The apparatus of claim 18, the switch means being operable to vary with time the second low-impedance current path from a low-impedance to a substantially greater impedance.

20. The apparatus of claim 19, wherein the switch means includes capacitive means and a diode connected in series circuit configuration with one another and with the charge storage means and the corresponding primary winding.

* * * * *